United States Patent
Ueng et al.

(10) Patent No.: US 9,973,217 B2
(45) Date of Patent: May 15, 2018

(54) SISO (SOFT INPUT SOFT OUTPUT) SYSTEM FOR USE IN A WIRELESS COMMUNICATION SYSTEM AND AN OPERATIONAL METHOD THEREOF

(71) Applicant: NATIONAL TSING HUA UNIVERSITY, Hsinchu (TW)

(72) Inventors: Yeong-Luh Ueng, Hsinchu (TW); Wei-Cheng Sun, Hsinchu (TW); Wei-Hsuan Wu, Hsinchu (TW); Chia-Hsiang Yang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 162 days.

(21) Appl. No.: 14/946,264

(22) Filed: Nov. 19, 2015

(65) Prior Publication Data

US 2016/0315638 A1    Oct. 27, 2016

(30) Foreign Application Priority Data

Apr. 21, 2015  (TW) .............................. 104112658 A

(51) Int. Cl.
  H03M 13/00  (2006.01)
  H03M 13/29  (2006.01)
(52) U.S. Cl.
  CPC .............................. H03M 13/2957 (2013.01)
(58) Field of Classification Search
  CPC ............. H03M 13/2957; H03M 13/25; H03M 13/6577; H03M 13/1171; H03M 13/258;

(Continued)

(56) References Cited

U.S. PATENT DOCUMENTS 6,629,287 B1 *  9/2003  Brink ................ H03M 13/2972
                                                    714/755
6,891,897 B1 *  5/2005  Bevan ..................... H04L 1/005
                                                    375/240

(Continued)

FOREIGN PATENT DOCUMENTS

TW          201325129 A      6/2013

OTHER PUBLICATIONS

Darabiha et al., "Power Reduction Techniques for LDPC Decoders", IEEE Journal of Solid-State Circuits, Aug. 2008, vol. 43, No. 8., pp. 1835-1845.

*Primary Examiner* — Guerrier Merant
(74) *Attorney, Agent, or Firm* — Hauptman Ham, LLP

(57) ABSTRACT

An iterative decoding device applied for a SISO (soft input soft output) system is disclosed, which comprises an operational control unit, a first decoder, and a second decoder. The operational control unit is operative to receive an encoded signal and divide the encoded signal into at least one frame. The first decoder is operative to receive each of the at least one frame and derive a renewed intrinsic information by a first iteration operation. The second decoder is operative to derive soft-information by a second iteration operation based on the renewed intrinsic information, and then transmit the soft-information back to the first decoder for the iteration operation of the next renewed intrinsic information. The operational control unit makes the at least one frame to be calculated respectively by the first decoder and the second decoder, thereby improving the efficiency and error ratio of a receiver.

52 Claims, 8 Drawing Sheets

(58) Field of Classification Search
CPC ........... H03M 13/3944; H03M 13/395; H03M 13/4107; H03M 13/45; H03M 13/06; H04L 1/0048; H04L 1/0618; H04L 25/03171; H04L 1/005; H04L 25/03337; H04L 1/0065; H04L 1/0055; H04L 1/006
See application file for complete search history.

(56) References Cited

U.S. PATENT DOCUMENTS

| | | | | |
|---|---|---|---|---|
| 2002/0016943 A1* | 2/2002 | Hunt | ................... | H03M 13/296 714/755 |
| 2002/0168017 A1* | 11/2002 | Berthet | ................. | H03M 13/25 375/267 |
| 2003/0084398 A1* | 5/2003 | Nguyen | ............ | H03M 13/2771 714/786 |
| 2003/0097633 A1* | 5/2003 | Nguyen | ............ | H03M 13/2957 714/786 |
| 2009/0094505 A1* | 4/2009 | Nguyen | ............ | H03M 13/2957 714/780 |
| 2009/0154600 A1 | 6/2009 | Kim et al. | | |
| 2009/0235146 A1* | 9/2009 | Tan | ................... | H03M 13/6331 714/780 |
| 2009/0319862 A1* | 12/2009 | Nguyen | ............ | H03M 13/2957 714/752 |
| 2011/0026601 A1* | 2/2011 | Mueller | ............. | H03M 13/1171 375/240.24 |
| 2011/0055667 A1* | 3/2011 | Wang | ..................... | H04L 1/005 714/780 |
| 2012/0159288 A1* | 6/2012 | Kamuf | ............ | H03M 13/3707 714/792 |
| 2012/0192028 A1* | 7/2012 | Allpress | ........... | H03M 13/2957 714/752 |
| 2012/0246539 A1* | 9/2012 | Nguyen | ............ | H03M 13/2725 714/755 |
| 2014/0219389 A1 | 8/2014 | Murakami et al. | | |

\* cited by examiner

SISO (SOFT INPUT SOFT OUTPUT) SYSTEM FOR USE IN A WIRELESS COMMUNICATION SYSTEM AND AN OPERATIONAL METHOD THEREOF

CROSS REFERENCE TO RELATED APPLICATIONS

This application claims the benefit of Taiwan Patent Application Ser. No. 104112658, filed on Apr. 21, 2015.

BACKGROUND OF THE INVENTION

Field of Invention

The present invention relates to an iterative decoding device, an iterative signal detection device, and an information update method for the same, and in particular to, an iterative decoding device which is applied for a SISO (soft input soft output) system.

Description of Prior Art

Nowadays, in the field of wireless communication systems, a transmitter will encode source information, the coded source information might be interfered by channel during a transmission process. However, it is possible to correct the error, finitely. In order to increase the data rate and the reliability, a MIMO (multi-input multi-output) system is used to transmit the above source information. However, in a relative receiver, each antenna will receive the source information and also be influenced by channel noise and other source information transmitted from other antennas.

Please refer to FIG. 1, which is a functional block diagram of a prior SISO systematic architecture, which comprises a conventional receiver. When the receiver receives the coded source information, a detector 11 therein the conventional receiver to interpret the source information transmitted by each of antennas, then the source information is inputted into a decoder 12 in turns; however, the detector 11 only transmits the soft-information to the decoder 12 by one way. There is no soft-information exchange between the detector 11 and the decoder 12 such that the system is unable to effectively use the soft-information to raise the system performance.

Please refer to FIG. 2, which is an information processing timing diagram of another prior SISO systematic architecture having differences from the architecture illustrated in FIG. 1 in that: the detector 11 is replaced by a first decoder and the decoder is replaced by a second decoder, in order to make the first decoder and the second decoder both functioning on soft-information exchange therebetween. However, an issue is found in FIG. 2 that although the soft-information exchange can be performed between the first decoder and the second decoder, the first decoder and the second decoder only can sequentially process one frame for each cycle period; namely, while the first decoder is processing a frame 1, the second decoder is idle; and then after the first decoder transmits the processed frame 1 to the second decoder for further operation, the first decoder is idle. In this manner, the operational speed of the system hardware is not only slowed but also the usage efficiency of the system hardware is lowered.

SUMMARY OF THE INVENTION

In order to solve technical problem of the conventional arts, an objective of the present invention is to provide an iterative decoding device applied for a SISO system, with soft-information exchange between a first processor of a first decoder and a second processor of a second decoder and different-time iteration operations of the first decoder and the second decoder, so as to achieve an optimal system performance and save memory usage thereof. Furthermore, with two-codeword scheduling, each two frames are able to be individually and respectively calculated in the first decoder and the second decoder, during the same cycle period, so as to eliminate idling elements, such that the working efficiency of the hardware and the data handling capacity are raised.

To achieve the above objective, the present invention provides an iterative decoding device, which comprises an operational control unit, a first decoder, and a second decoder.

The operational control unit is operative to receive an encoded signal and divide the encoded signal into at least one frame.

The first decoder is operative to receive each of the frames and derive a renewed intrinsic information based on the received frame by a first iteration operation.

The second decoder is operative to receive the renewed intrinsic information from the first decoder, wherein the second decoder derives a soft-information by a second iteration operation, based on the renewed intrinsic information, and then transmit the soft-information back to the first decoder for the iteration operation of the next renewed intrinsic information, the operational control unit makes the at least one frame to be calculated respectively by the first decoder and the second decoder. While the at least one frame is two frames, the operational control unit makes the at least one frame to be calculated respectively by the first decoder and the second decoder, during the same cycle period.

In a preferred embodiment, the operational control unit comprises a two-codeword scheduling used to make the two frames calculated by the first decoder and the second decoder, during the same cycle period.

In a preferred embodiment, times of the iteration operations preset in the respective first decoder and/or the respective second decoder are used to decide whether the second decoder outputs the soft-information not fed back to the first decoder In a preferred embodiment, the first decoder and the second decoder are both a soft input soft output decoder.

In a preferred embodiment, a formula of the first iteration operation of the first decoder is: the renewed intrinsic information=$L_{M,(k)}^{P} - L_{M,(k-1)}^{P}$; wherein K means times of iteration operation, and K is a positive integer; $L_{M,(k)}^{P}$=current first A Posteriori probability, when K=1, the first decoder calculates the frame to derive the current first A Posteriori probability $L_{M,(k)}^{P}$; when K>1, the soft-information fed back from the second decoder to the first decoder are calculated with the frame, to derive the current first A Posteriori probability $L_{M,(k)}^{P}$, and; $L_{M,(k-1)}^{P}$=previous first A Posteriori probability, when K=1, $L_{M,(k-1)}^{P}$=0; when K>1, $L_{M,(k-1)}^{P}$ is equal to the previous first A Posteriori probability stored in the first decoder.

In a preferred embodiment, the second iteration operation of the second decoder further comprises a second outer iteration operation, which comprises:

Current second A Posteriori probability=$L_{D,(k)}^{P}$, K means times of iteration operations, and K is a positive integer; $L_{M,(k)}^{P}$=current first A Posteriori probability, when K=1, the first decoder calculates the frame to derive the current first A Posteriori probability $L_{M,(k)}^{P}$; when K>1, the soft-information fed back from the second decoder to the first decoder are calculated with the frame, to derive the current first A Posteriori probability $L_{M,(k)}{}^P$, and; $L_{M,(k-1)}{}^P$=previous first A Posteriori probability, when K=1, $L_{M,(k-1)}{}^P$=0; when K>1, $L_{M,(k-1)}{}^P$ is equal to the previous first A Posteriori probability stored in the first decoder; the renewed intrinsic information=$L_{M,(k)}{}^P$-$L_{M,(k-1)}{}^P$; $L_{D,(k)}{}^P$=current second A Posteriori probability, which is derived according to the renewed intrinsic information received by the second decoder; $L_{D,(k-1)}{}^P$=previous second A Posteriori probability, when K=1, $L_{D,(k-1)}{}^P$=0; when K>1, $L_{D,(k-1)}{}^P$ is equal to the previous second A Posteriori probability stored in the second decoder; and the second decoder calculates the current second A Posteriori probability to derive the soft-information.

In a preferred embodiment, the second iteration operation of the second decoder further comprises a second inner iteration operation, that: the previous second A Posteriori probability $L_{D,(k-1)}{}^P$ stored in the second decoder is calculated inside the second decoder by the second inner iteration operation to derive the soft-information, the second decoder outputs the soft-information until reaching times of the second inner iteration operation preset in the second decoder.

To achieve the above objective, the present invention provides another iterative decoding device applied for a SISO system, which comprises a first decoder, and a second decoder.

The first decoder comprises a first processor and a first A Posteriori probability memory.

The first processor is used to derive a current first A Posteriori probability according to each frame. The first A Posteriori probability memory is used to store a previous first A Posteriori probability generated by the first A Posteriori probability, wherein a renewed intrinsic information is derived according to the current first A Posteriori probability derived by the first processor and the previous first A Posteriori probability stored in the first A Posteriori probability memory.

The second decoder is used to derive a soft-information by a second iteration operation based on the renewed intrinsic information, and then transmit the soft-information back to the first decoder for the iteration operation of the next renewed intrinsic information, the operational control unit makes the at least one frame to be calculated respectively by the first decoder and the second decoder, during the same cycle period.

In a preferred embodiment, the second decoder outputs the soft-information when reaching times of iteration operation.

In a preferred embodiment, the first decoder further comprises a subtractor, which is used to generate the renewed intrinsic information by subtracting the previous first A Posteriori probability from the current first A Posteriori probability.

In a preferred embodiment, the second decoder further comprises an intrinsic information updating memory, a second A Posteriori probability memory, an adder module, and a second processor.

The intrinsic information updating memory is used to store the renewed intrinsic information therein. The second A Posteriori probability memory is used to store a previous second A Posteriori probability therein. The adder module is used to generate a current second A Posteriori probability by adding the renewed intrinsic information to the previous second A Posteriori probability. The second processor is used to receive the current second A Posteriori probability, and generate the soft-information for being stored in the second A Posteriori probability memory.

In a preferred embodiment, the second decoder further comprises a second A Posteriori probability memory, an adder module, and a second processor.

The second A Posteriori probability memory is used to store a previous second A Posteriori probability. The adder module is used to generate a current second A Posteriori probability by adding the renewed intrinsic information to the previous second A Posteriori probability. The second processor is used to receive the current second A Posteriori probability, and generate the soft-information to be stored in the second A Posteriori probability memory.

In a preferred embodiment, the first processor and the second processor respectively operate different frames during the same cycle time, and the first A Posteriori probability memory and the second A Posteriori probability memory respectively comprise a first memory block and a second memory block, the first memory block of the first A Posteriori probability memory and the second memory block of the first A Posteriori probability memory are used to read/write the previous first A Posteriori probabilities corresponding to different frames, and the first memory block of the second A Posteriori probability memory and the second memory block of the second A Posteriori probability memory are used to read/write the previous second A Posteriori probabilities or the soft-information corresponding to different frames.

In a preferred embodiment, a formula of the first iteration operation of the first decoder is that: the renewed intrinsic information=$L_{M,(k)}{}^P$-$L_{M,(k-1)}{}^P$; wherein K means times of iteration operation, and K is a positive integer; $L_{M,(k)}{}^P$=current first A Posteriori probability, when K=1, the first decoder calculates the frame to derive the current first A Posteriori probability $L_{M,(k)}{}^P$; when K>1, the soft-information fed back from the second decoder to the first decoder are calculated with the frame, to derive the current first A Posteriori probability $L_{M,(k)}{}^P$, and; $L_{M,(k-1)}{}^P$=previous first A Posteriori probability, when K=1, $L_{M,(k-1)}{}^P$=0; when K>1, $L_{M,(k-1)}{}^P$ is equal to the previous first A Posteriori probability stored in the first decoder.

In a preferred embodiment, the second iteration operation of the second decoder further comprises a second outer iteration operation, which comprises:

Current second A Posteriori probability=$L_{D,(k)}{}^P$, K means times of iteration operations, and K is a positive integer; $L_{M,(k)}{}^P$=current first A Posteriori probability, when K=1, the first decoder calculates the frame to derive the current first A Posteriori probability $L_{M,(k)}{}^P$; when K>1, the soft-information fed back from the second decoder to the first decoder are calculated with the frame, to derive the current first A Posteriori probability $L_{M,(k)}{}^P$, and; $L_{M,(k-1)}{}^P$=previous first A Posteriori probability, when K=1, $L_{M,(k-1)}{}^P$=0; when K>1, $L_{M,(k-1)}{}^P$ is equal to the previous first A Posteriori probability stored in the first decoder; the renewed intrinsic information=$L_{M,(k)}{}^P$-$L_{M,(k-1)}{}^P$; $L_{D,(k)}{}^P$=current second A Posteriori probability, which is derived according to the renewed intrinsic information received by the second decoder; $L_{D,(k-1)}{}^P$=previous second A Posteriori probability, when K=1, $L_{D,(k-1)}{}^P$=0; when K>1, $L_{D,(k-1)}{}^P$ is equal to the previous second A Posteriori probability stored in the second decoder; and the second decoder calculates the current second A Posteriori probability to derive the soft-information.

In a preferred embodiment, the second iteration operation of the second decoder further comprises a second inner iteration operation, that:

The previous second A Posteriori probability $L_{D,(k-1)}{}^P$ stored in the second decoder is calculated inside the second decoder by the second inner iteration operation to derive the soft-information, the second decoder outputs the soft-information until reaching times of the second inner iteration operation preset in the second decoder.

To achieve the above objective, the present invention provides an operational method of an iterative decoding device applied for a SISO system, the method comprises:

A step S01, a first decoder receives a frame, to derive a renewed intrinsic information by a first iteration operation.

A step S02, receiving the renewed intrinsic information by a second decoder, to generate a soft-information by a second iteration operation.

A step S03, determining whether times of the first decoder or the second decoder are reached. If no, performing a step S04. If yes, performing a step S05.

The step S04, transmitting the soft-information to the first decoder, then performing a step S06.

The step S05, outputting the soft-information by the second decoder.

The step S06, performing the first iteration operation by the first decoder, according to the frame and the soft-information, to generate the renewed intrinsic information, then performing the step S02. The renewed intrinsic information and the soft-information are transmitted between the first decoder and the second decoder with a frame form, and the first decoder and the second decoder respectively calculate different frames during the same cycle period.

In a preferred embodiment, the step S01 further comprises the following steps of proceeding the first iteration operation: a first processor of the first decoder receives the frame to generate a current first A Posteriori probability; and using a subtractor to subtract a previous first A Posteriori probability stored in a first A Posteriori probability memory from the current first A Posteriori probability, so as to generate the renewed intrinsic information.

In a preferred embodiment, the step S02 further comprises the following steps of proceeding the second iteration operation: transmitting the renewed intrinsic information to an intrinsic information memory of the second decoder; using an adder module to add the renewed intrinsic information to a previous second A Posteriori probability stored in a second A Posteriori probability memory so as to generate a current second A Posteriori probability; and transmitting the current second A Posteriori probability to the second processor so as to derive the soft-information.

In a preferred embodiment, the step S02 further comprises the following steps of proceeding the second iteration operation: using an adder module to add the renewed intrinsic information to a previous second A Posteriori probability stored in a second A Posteriori probability memory of the second decoder to derive a current second A Posteriori probability; and transmitting the current second A Posteriori probability to a second processor so as to derive the soft-information.

In a preferred embodiment, the first A Posteriori probability memory and the second A Posteriori probability memory respectively comprises a first memory block and a second memory block, the first memory block of the first A Posteriori probability memory and the second memory block of the first A Posteriori probability memory are used to read/write the previous first A Posteriori probabilities corresponding to different frames, and the first memory block of the second A Posteriori probability memory and the second memory block of the second A Posteriori probability memory are used to read/write the previous second A Posteriori probabilities or the soft-information corresponding to different frames.

In order to achieve the above objective, the present invention provides an iterative signal detection device, which comprises the iterative decoding device of any one of the above preferred embodiments.

With respect to the conventional art, the present invention uses the two-codeword scheduling to make the two decoders calculate different frames during the same cycle period. Idle time of the decoders is decreased, and the operation time of signal process is shortened.

DETAILED DESCRIPTION OF THE PREFERRED EMBODIMENTS

The following description of embodiments, with reference to the accompanying drawings, is used to exemplify a specific embodiment which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention.

Figure 3:
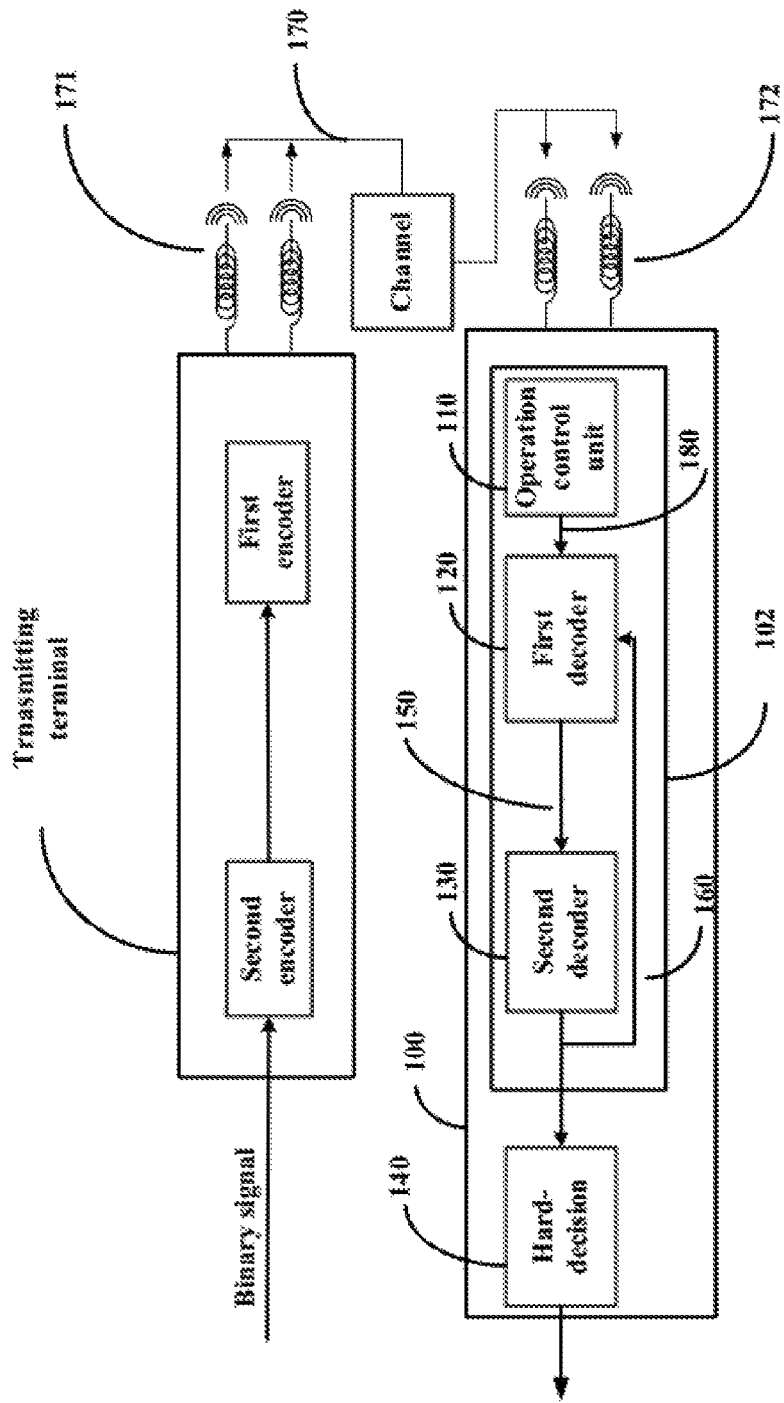
FIG. 3 is a functional block diagram of a SISO systematic architecture according to a first embodiment of the present invention.

Please refer to FIG. 3, which is a functional block diagram of a SISO systematic architecture according to a first embodiment of the present invention. The SISO system comprises a binary information, which is encoded at a transmitter to generate a encoded signal 170, then the encoded signal 170 is transmitted from two transmitting antennas 171 of the transmitter to two receiving antennas 172 of a receiver 100 via a channel, the receiver 100 comprises an iterative decoding device 102 and a hard-decision 140. The iterative decoding device 102 comprises an operational unit 110, a first decoder 120, and a second decoder 130.

In the embodiment, the operational control unit 110 is used to receive an encoded signal 170 and divide the encoded signal 170 into at least one frame 180. The operational control unit 110 comprises a two-codeword scheduling used for separating each of the encoded signals 170 into two frames 180 and making the two frames 180 to be respectively calculated by the first decoder 120 and the second decoder 130, during the same cycle period.

The first decoder 120 is used to receive each of the frames 180 and derive a renewed intrinsic information 150 by a first iteration operation with a first iteration operation. The second decoder 130 is used to receive the renewed intrinsic information 150 from the first decoder 120, and derive a soft-information 160 by a second iteration operation based on the renewed intrinsic information 150, and then transmit the soft-information 160 back to the first decoder 120.

Generally, one iteration operation indicates the frame 180 has been calculated by one first iteration operation and one second iteration operation. In other words, two iteration operations indicates the frame 180 has being calculated by two first iteration operations and two second iteration operations, and so on, without repeating.

The frame 180 exists as a format of the renewed intrinsic information and the soft-information 160 in the first decoder 120 and the second decoder 130.

In the embodiment, the first decoder 120 and/or the second decoder 130 has/have already preset the times of the respective iteration operation; when finishing the preset calculated times, it is determined that iterative decoding device 102 outputs the soft-information to the hard-decision 140, and the hard-decision 140 outputs a hard-information. In the embodiment, the first decoder 120 and the second decoder 130 are both SISO decoders.

Figure 4:
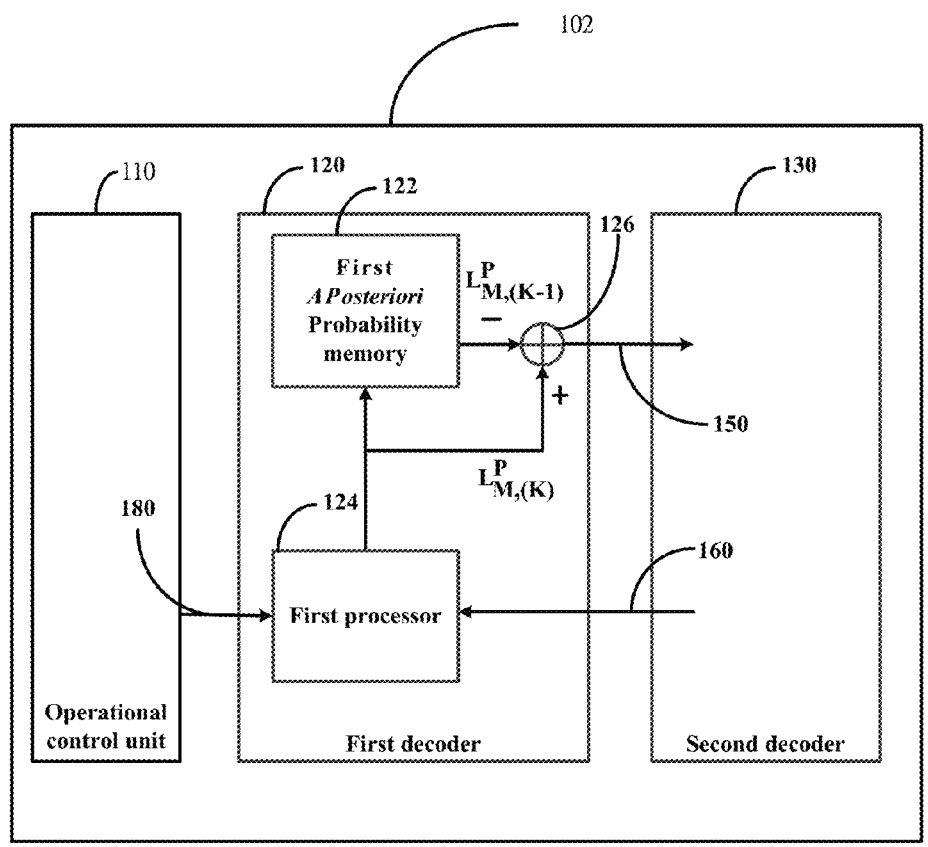
FIG. 4 is a schematic illustrative diagram of a first decoder of an iterative decoding device according to the first embodiment of the present invention.

Please refer to FIG. 4, which is a schematic illustrative diagram of a first decoder of an iterative decoding device according to the first embodiment of the present invention. The first decoder 120 comprises a first processor 124, a first A Posteriori probability memory 122, and a subtractor 126. The first processor 124 is used to receive each frame 180 and derive a current first A Posteriori probability $L_{M,(k)}^{P}$ according to each of the frame 180. The first A Posteriori probability memory 122 is used to store a previous first A Posteriori probability $L_{M,(k-1)}^{P}$ generated by the first A Posteriori probability $L_{M,(k)}^{P}$. The subtractor 126 is used to generate the renewed intrinsic information 150 by subtracting the previous first A Posteriori probability from the current first A Posteriori probability $L_{M,(k)}^{P}$. In the embodiment, the first decoder 120 transmits the current first A Posteriori probability $L_{M,(k)}^{P}$ to the first A Posteriori probability memory 122, to replace the previous first A Posteriori probability, which is needed for the next first iteration operation. A formula of the first iteration operation is:

The renewed intrinsic information 150=$L_{M,(k)}^{P}-L_{M,(k-1)}^{P}$, wherein K means times of iteration operations, and K is a positive integer.

$L_{M,(k)}^{P}$=current first A Posteriori probability; when K=1, the first decoder 120 calculates the frame 180 to derive the current first A Posteriori probability $L_{M,(k)}^{P}$; when K>1, the soft-information 160 fed back from the second decoder 130 to the first decoder 120 is calculated with the frame 180, so as to derive the current first A Posteriori probability $L_{M,(k)}^{P}$. $L_{M,(k-1)}^{P}$=previous first A Posteriori probability, when K=1, $L_{M,(k-1)}^{P}$=0; when K>1, $L_{M,(k-1)}^{P}$ is equal to the previous first A Posteriori probability stored in the first decoder 120.

The operational control unit 110 makes the at least two frames 180 be calculated respectively by the first decoder 120 and the second decoder 130 during the same cycle period, and makes the first decoder 120 and the second decoder 130 process different frames 180 during the same cycle period, so the idle time of elements is decreased, then the decoding speed is increased, hence, the working efficiency of the hardware and the data handling capacity are raised.

Figure 5:
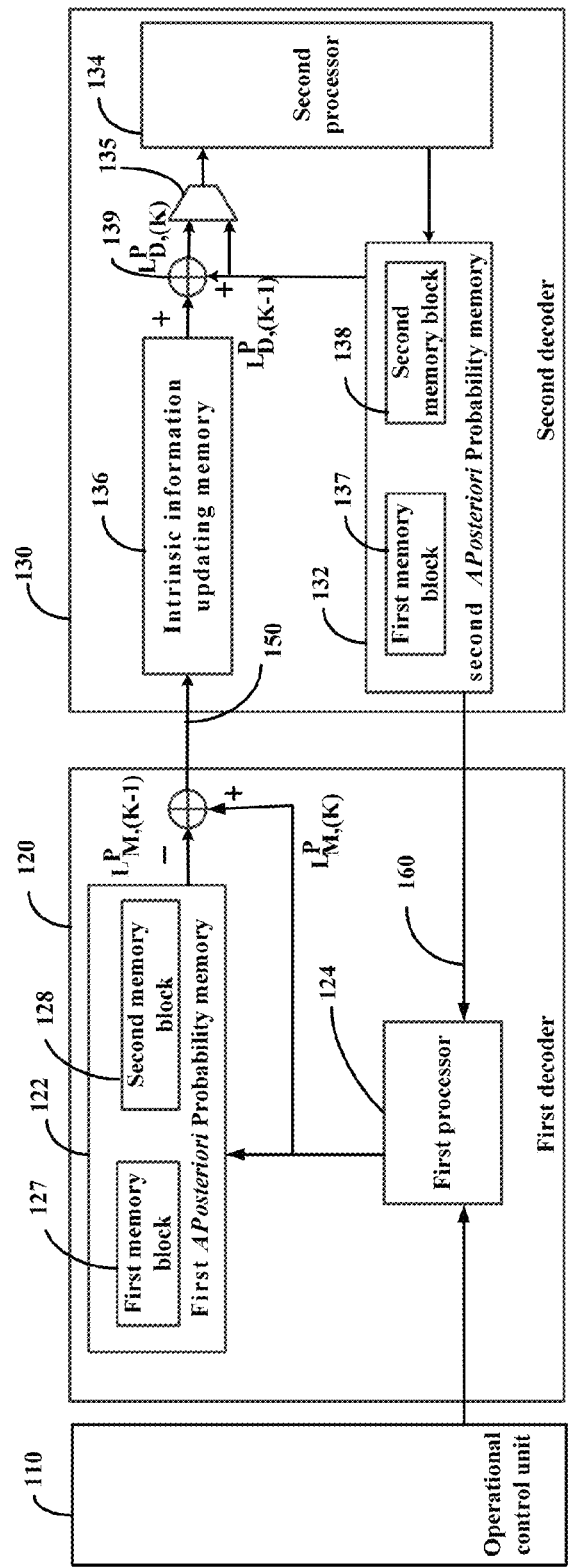
FIG. 5 is a schematic illustrative diagram of the iterative decoding device according to the first embodiment of the present invention.

Please refer to FIG. 5, which is a schematic illustrative diagram of the iterative decoding device according to the first embodiment of the present invention. The second decoder 130 further comprises a intrinsic information updating memory 136, a second A Posteriori probability 132, a second processor 134, and an adder module 139. The intrinsic information updating memory 136 is used to store the renewed intrinsic information 150 which is transmitted from the first decoder 120. The adder module 139 is used to generate a current second A Posteriori probability $L_{D,(k)}^{P}$ by adding of the renewed intrinsic information 150 to the previous second A Posteriori probability $L_{D,(k-1)}^{P}$, the second processor 134 is used to receive the current second A Posteriori probability, and generate the soft-information 160 to be stored in the second A Posteriori probability memory 132. In the embodiment, the current second A Posteriori probability is stored in the second A Posteriori probability memory 132, to replace the previous second A Posteriori probability, which is needed for the next second iteration operation. A second iteration operation of the second decoder 130 further comprises a second outer iteration operation, that:

A current second A Posteriori probability=$L_{D,(k)}^{P}$, K means times of iteration operation, and K is a positive integer. $L_{M,(k)}^{P}$=current first A Posteriori probability, when K=1, the first decoder 120 calculates the frame 180 to derive the current first A Posteriori probability $L_{M,(k)}^{P}$; when K>1, the soft-information 160 fed back from the second decoder 130 to the first decoder 120 is calculated with the frame 180, so as to derive the current first A Posteriori probability $L_{M,(k)}^{P}$. $L_{M,(k-1)}^{P}$=previous first A Posteriori probability; when K=1, $L_{M,(k-1)}^{P}$=0; when K>1, $L_{M,(k-1)}^{P}$ is equal to the previous first A Posteriori probability stored in the first decoder 120.

The renewed intrinsic information=$L_{M,(k)}^{P}-L_{M,(k-1)}^{P}$. $L_{D,(k)}^{P}$=current second A Posteriori probability, which is derived according to the renewed intrinsic information 150 received by the second decoder 130. $L_{D,(k-1)}^{P}$=previous second A Posteriori probability; when K=1, $L_{D,(k-1)}^{P}$=0; when K>1, $L_{D,(k-1)}^{P}$ is equal to the previous second A Posteriori probability stored in the second decoder 130. The second decoder 130 calculates the current second A Posteriori probability to derive the soft-information.

The second iteration operation of the second decoder 130 further comprises a second inner iteration operation that:

the previous second A Posteriori probability $L_{D,(k-1)}^{P}$ stored in the second decoder 130 is calculated inside the second decoder 130 by the second inner iteration operation to derive the soft-information 160, the second decoder 160 outputs the soft-information 160 until reaching times of the second inner iteration operation preset in the second decoder 130.

The first A Posteriori probability memory 122 of the first decoder 120 comprises a first memory block 127 and a second memory block 128 to store each two frames 180, which are corresponding with the previous first A Posteriori probability $L_{M,(k-1)}^{P}$, the second A Posteriori probability memory 132 of the second decoder 130 respectively comprises a first memory block 137 and a second memory block 138 to store each two frames 180, which correspond with the previous second A Posteriori probability $L_{D,(k)}^{P}$. The constitution, calculation, and actuation process of the other elements are the same as shown in FIG. 4, and are not repeated here.

In an application embodiment, the second iteration operation of the second decoder 130 comprises: using a multiplexer 135 to perform an alternative selection, wherein one selection is that: when the current second A Posteriori probability $L_{D,(k)}^P$ which is inputted to the second decoder 134, the soft-information derived by the second decoder 134 is stored in the second A Posteriori probability memory 132 of the second decoder, the above is called a first time of the second iteration operation. Another selection is that: if another time of the second iteration is actuated, then the previous second probability of the second probability memory 132 of the second decoder 130 is read and input to the second decoder 130, to derive the soft-information 160, the above is called a second time of the second iteration operation. The second inner iteration operation of the second processor 134 is able to set the calculated times advanced. Because of using the two-codeword scheduling, the first memory block 137 of the second A Posteriori probability memory 132 of the second decoder 130 and the second memory block 138 of the second A Posteriori probability memory 132 of the second decoder 130 are used to read/write the previous second A Posteriori probabilities $L_{D,(k-1)}^P$ or the soft-information 160 corresponding to different frames 180.

Further referring to FIGS. 4 and 5, the soft-information 160 stored in the second A Posteriori probability memory 132 of the second decoder 130 is fed back to the first processor 124 of the first decoder 120, the soft-information 160 exchanged between the first decoder 120 and the second decoder 130 is done so that a better system performance is reached, and the memory usage is decreased.

Figure 6:
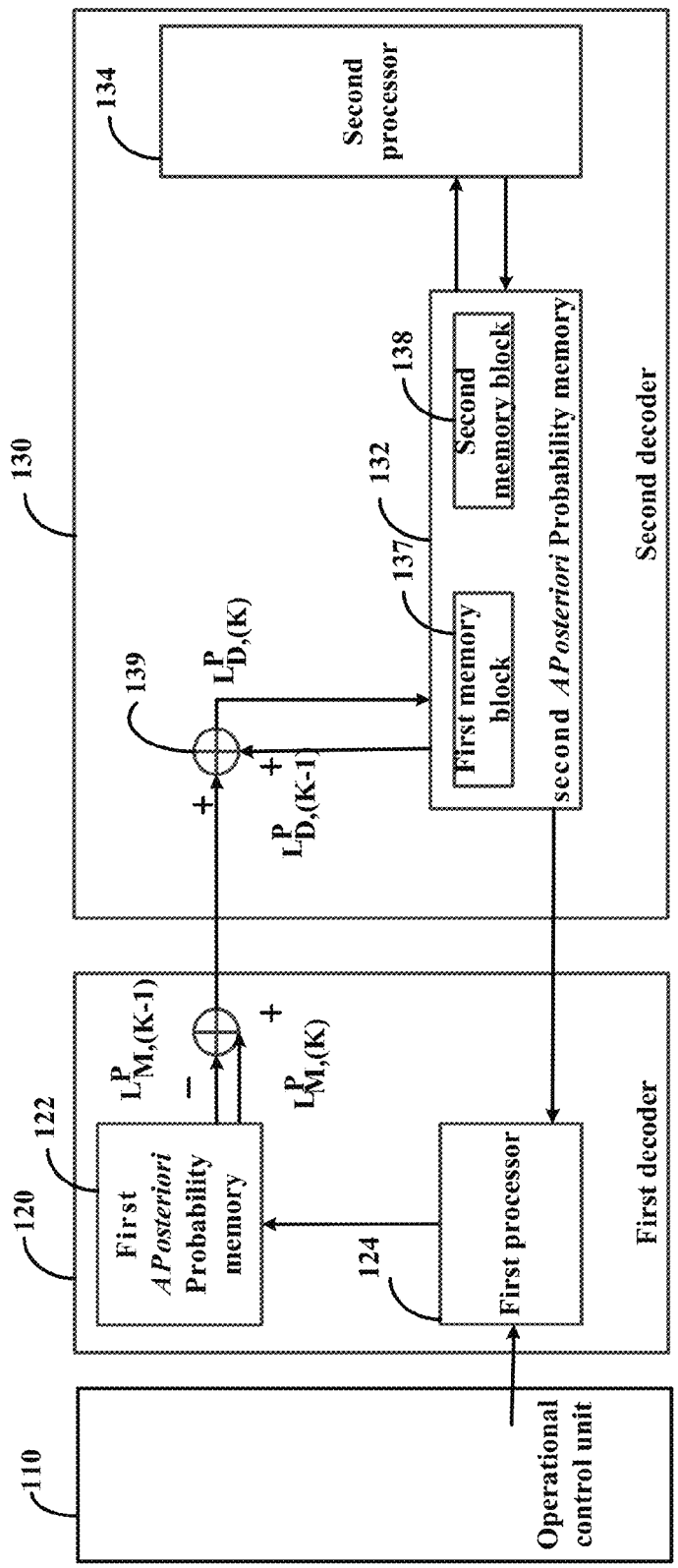
FIG. 6 is a functional block diagram of a SISO systematic architecture according to a second embodiment of the present invention.

Please refer to FIG. 6, which is a functional block diagram of a SISO systematic architecture according to a second embodiment of the present invention. The difference between the second embodiment and the first embodiment is that: the second embodiment of the present invention does not use the intrinsic information updating memory. In the second embodiment, the current first A Posteriori probability $L_{M,(k)}^P$ (K means K(th) time(s) of outer iteration operation) and the previous first A Posteriori probability $L_{M,(k-1)}^P$ derived by the first decoder 124, the current second A Posteriori probability and the previous second A Posteriori probability are derived by the second decoder 134, the calculation formula is:

$$L_{D,(k)}^P = L_{D,(k-1)}^P + L_{M,(k)}^P - L_{M,(k-1)}^P$$

The constitution, calculation, and actuation process of the other elements are the same as shown in FIG. 5 and are not repeated herein. With respect with the first embodiment, the second embodiment further omits the intrinsic information updating memory, to decrease the occupying space of the memory.

Figure 7:
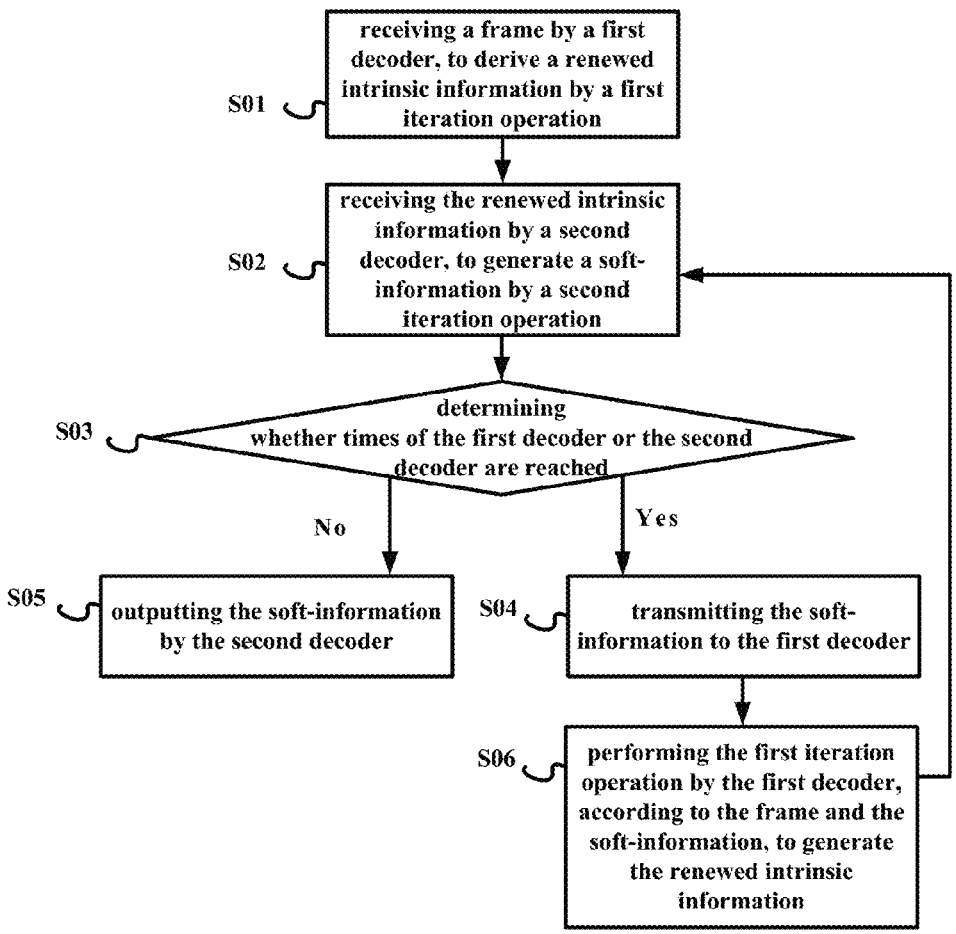
FIG. 7 is a flow chart of the operational method of the iterative decoding device according to the present invention.

FIG. 7 is a flow chart of the operational method of the iterative decoding device according to the present invention, which comprises following steps of:

a Step S01, receiving a frame 180 by a first decoder 120, to derive a renewed intrinsic information 150 by a first iteration operation.

a Step S02, receiving the renewed intrinsic information 150 by a second decoder 130, to generate a soft-information 160 by a second iteration operation.

a Step S03, determining whether times of the first decoder 120 or the second decoder 130 are reached. If no, performing a step S04; and otherwise, performing a step S05.

The step S04, transmitting the soft-information 160 to the first decoder 120, then performing a step S06.

The step S05, outputting the soft-information 160 by the second decoder.

The step S06, performing the first iteration operation by the first decoder 120 according to the frame 180 and the soft-information 160, to generate the renewed intrinsic information 150, then performing the step S02.

The step S01 further comprises the following steps of proceeding the first iteration operation: receiving the frame 180 by a first processor 124 of the first decoder 120, so as to generate a current first A Posteriori probability $L_{M,(k)}^P$; and using a subtractor 126 to subtract a previous first A Posteriori probability $L_{M,(k-1)}^P$ stored in a first A Posteriori probability memory 122 of the first decoder 120 from the current first A Posteriori probability $L_{M,(k)}^P$, so as to generate the renewed intrinsic information 150

In the first embodiment, the step S02 further comprises following steps of proceeding the second iteration operation: transmitting the renewed intrinsic information 150 to an intrinsic information memory 136 of the second decoder 130; and using an adder module to add the renewed intrinsic information 150 to a previous second A Posteriori probability $L_{D,(k-1)}^P$ stored in a second A Posteriori probability memory 132 so as to generate a current second A Posteriori probability $L_{D,(k)}^P$; and transmitting the current second A Posteriori probability $L_{D,(k)}^P$ to the second processor 134, so as to derive the soft-information 160.

In the second embodiment, the step S02 further comprises following steps of proceeding the second iteration operation: using an adder module to add the renewed intrinsic information 150 to a previous second A Posteriori probability $L_{D,(k-1)}^P$ stored in a second A Posteriori probability memory 132 of the second decoder 130 so as to derive a current second A Posteriori probability $L_{D,(k)}^P$, and transmitting the current second A Posteriori probability $L_{D,(k)}^P$ to a second processor 134, so as to derive the soft-information 160.

Figure 1:
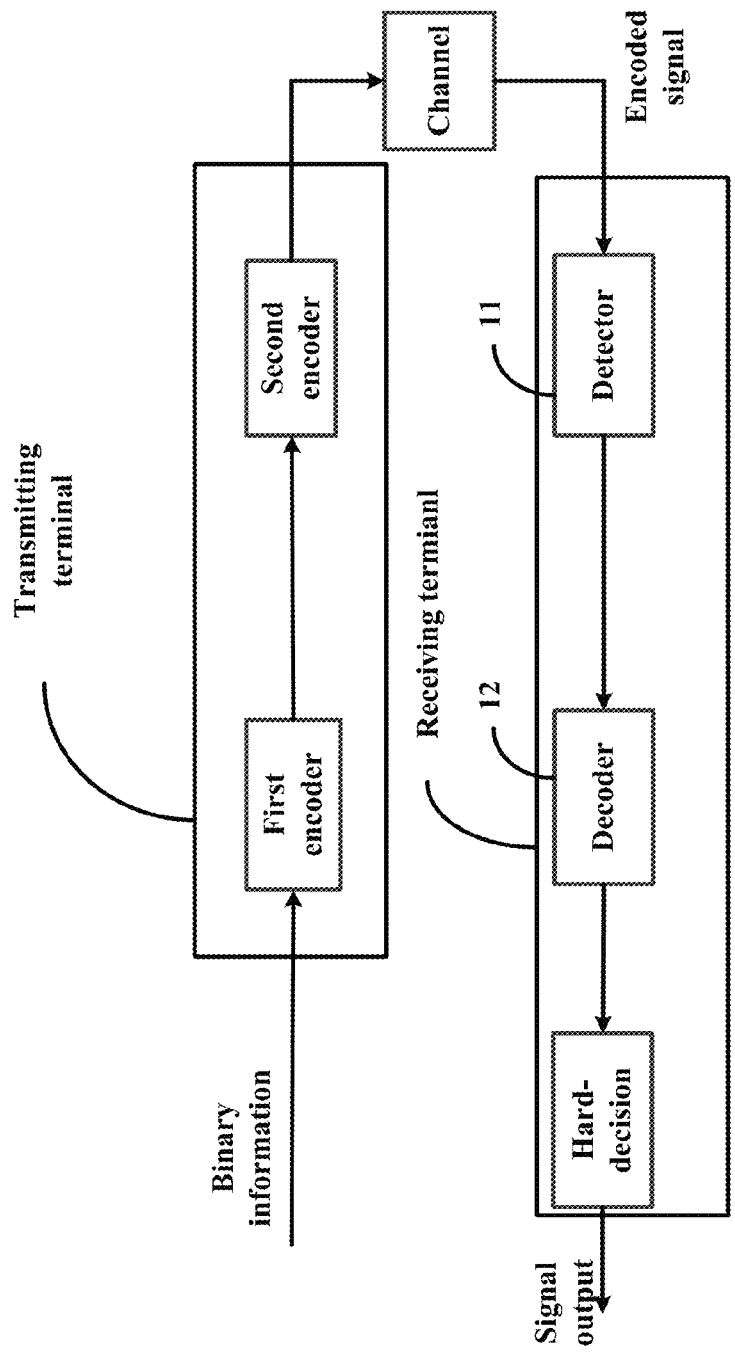
FIG. 1 is a functional block diagram of a SISO systematic architecture of the conventional art.
Figure 2:
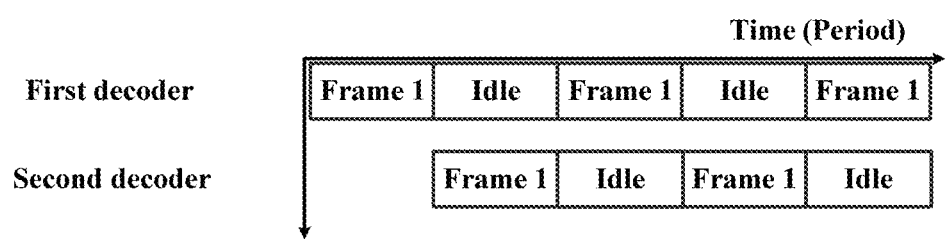
FIG. 2 is an information processing timing diagram of a SISO systematic architecture according to another conventional art.
Figure 8:
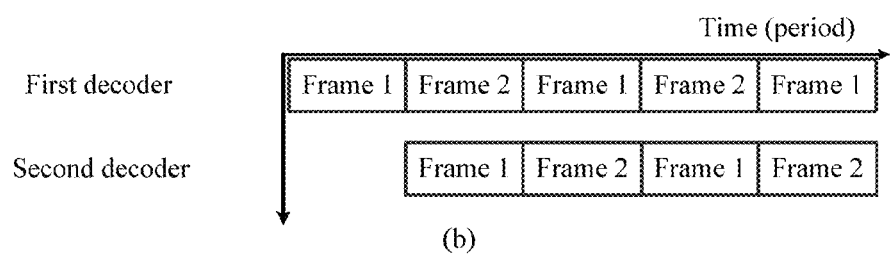
FIG. 8 is an information processing timing diagram of a SISO systematic architecture adopting a two-codeword scheduling according to the present invention.

FIG. 8 is an information processing timing diagram of a SISO systematic architecture adopting a two-codeword scheduling according to the present invention. With respect to FIG. 2, by usage of the two-codeword scheduling, a frame 1 and another frame 2 are calculated respectively by the first decoder 120 and the second decoder 130 during the same cycle period, thereby improving the efficiency, eliminating idle elements, and increasing data handling capacity.

Figure 9:
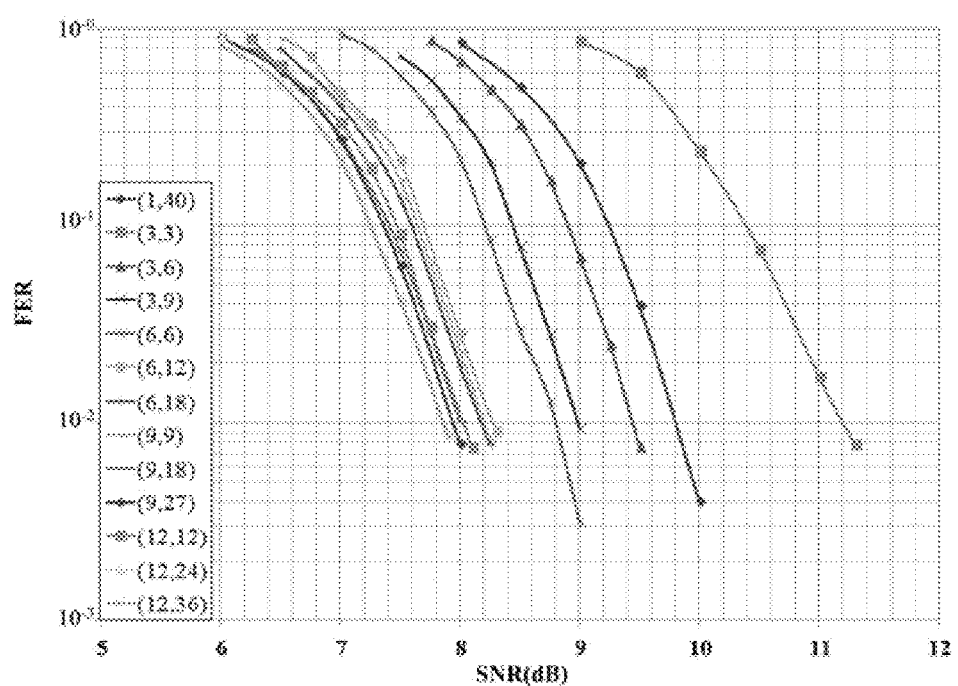
FIG. 9 is a comparison diagram of the iteration numbers, frame error-ratio, and signal-noise ratio of the first decoder and the second decoder by C-language certification.

Please refer to FIG. 9, which is a comparison diagram among the iteration numbers, frame error-ratio, and signal-noise ratio of the first decoder and the second decoder by C-language certification. C language certifies the relationship of the times of the first decoder 120 and the times of the second decoder 130. In the figure, "a" means a total calculating times of the first decoder 120, "b" means a total calculating times of the second decoder 130, Y-axis means FRE (frame error rate), X-axis means SNR (signal/noise ratio, measured in db). Take (a=1, b=40) and (a=10, b=10) for example, (a=1, b=40) is an conventional architecture, the first decoder 120 derives the soft-information 160 and outputs the soft-information 160 to the second decoder 130, the second decoder 130 proceeds 40 times iteration operations, the A Posteriori probability derived by the second decoder 130 are not transmitted back to the first decoder 120, which is the best system performance of the conventional architecture. In a design architecture (a=10, b=10) of an iterative decoding device applied for a SISO system provided by the present invention, the second decoder 130 derives the soft-information 160 and outputs the soft-information to the first decoder 120, the second decoder 130 proceeds one time iteration to derive the A Posteriori probability and feeds the A Posteriori probability back to the first decoder 120, back and forth for 10 times, to complete soft-information exchanges between the first decoder 120 an the second decoder 130. With the design architecture (6,6), (7,7), (8,8), (9,9), (10,10) of an iterative decoding device applied for a SISO system, the system performance is at least 1 db gain better than the conventional architecture.

With above description, the iterative decoding device applied for a SISO system of the present invention is able to achieve better system performance and saving memory usage according to the soft-information 160 exchange between the first decoder 120 and the second decoder 130, and the different times of iteration operation. With two-codeword scheduling, each two frames are able to be respectively calculated in the first decoder 120 and the second decoder 130 during the same cycle period, idling of elements is eliminated, the working efficiency of the hardware and the data handling capacity are raised, which improves the drawbacks of the conventional art.

In a preferred embodiment, an iterative signal detection device is disclosed, which comprises one or a combination of the iterative decoding device, the first decoder 120, and the second decoder 130 according above description. The iterative signal detection device can be a MIMO or one antenna detection device, to broaden the application fields.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A SISO (soft input soft output) system for use in a wireless communication system, comprising:
   a transmitting terminal for generating an encoded signal by at least one transmitting antenna, the encoded signal indicative of electronic data;
   a channel in electronic communication with the transmittal terminal; and
   a receiver for receiving the encoded signal from the transmitting terminal via the channel by at least one receiving antenna, comprising:
   an operational control unit operative to receive the encoded signal and divide the encoded signal into at least one frame;
   a first decoder operative to receive each of the at least one frame and derive a renewed intrinsic information based on the received frame by a first iteration operation;
   a second decoder operative to derive a soft-information based on the renewed intrinsic information directly received from the first decoder by a second iteration operation, and transmit the soft-information directly back to the first decoder for the iteration operation of the next renewed intrinsic information, and the at least one frame is calculated by the first decoder and the second decoder according to an instruction of the operational control unit, wherein when the at least one frame is two frames, the operational control unit makes the at least one frame to be calculated by the first decoder and the second decoder, during the same cycle period; and
   a hard-decision for receiving the soft-information from the second decoder and outputting a hard-information, wherein the hard-information comprises information of at least one of image, voices, and text.

2. The SISO system according to claim 1, wherein the operational control unit comprises a two-codeword scheduling that is used to make the two frames to be calculated by the first decoder and the second decoder, during the same cycle period.

3. The SISO system according to claim 1, wherein a number of the iteration operations preset in the respective first decoder and/or the respective second decoder are used to decide whether the second decoder outputs the soft-information not fed back to the first decoder.

4. The SISO system according to claim 1, wherein the first decoder and the second decoder both are a soft input soft output decoder.

5. The SISO system according to claim 1, wherein a formula of the first iteration operation of the first decoder is:
   the renewed intrinsic information=$L_{M,(k)}^P - L_{M,(k-1)}^P$;
   wherein K means the times of iteration operations, and K is a positive integer;
   $L_{M,(k)}^P$=a current first A Posteriori probability,
   when K=1, the first decoder calculates the frame to derive the current first A Posteriori probability $L_{M,(k)}^P$; or
   when K>1, the soft-information fed back from the second decoder to the first decoder are calculated with the frame, to derive the current first A Posteriori probability $L_{M,(k)}^P$, and;
   $L_{M,(k-1)}^P$=a previous first A Posteriori probability,
   when K=1, $L_{M,(k-1)}^P$=0;
   when K>1, $L_{M,(k-1)}^P$ is equal to the previous first A Posteriori probability stored in the first decoder.

6. The SISO system according to claim 1, wherein the second iteration operation of the second decoder further comprises a second outer iteration operation, which comprises:
   a current second A Posteriori probability=$L_{D,(k)}^P - L_{D,(k-1)}^P + L_{M,(k)}^P - L_{M,(k-1)}^P$,
   wherein K means times of iteration operations, and K is a positive integer;
   $L_{M,(k)}^P$=a current first A Posteriori probability,
   when K=1, the first decoder calculates the frame to derive the current first A Posteriori probability $L_{M,(k)}^P$; or
   when K>1, the soft-information fed back from the second decoder to the first decoder are calculated with the frame, to derive the current first A Posteriori probability $L_{M,(k)}^P$, and;
   $L_{M,(k-1)}^P$=a previous first A Posteriori probability,
   when K=1, $L_{M,(k-1)}^P$=0;
   when K>1, $L_{M,(k-1)}^P$ is equal to the previous first A Posteriori probability stored in the first decoder;
   the renewed intrinsic information=$L_{M,(k)}^P - L_{M,(k-1)}^P$;
   $L_{D,(k)}^P$=a current second A Posteriori probability, which is derived according to the renewed intrinsic information received by the second decoder;
   $L_{D,(k-1)}^P$=a previous second A Posteriori probability,
   when K=1, $L_{D,(k-1)}^P$=0;
   when K>1, $L_{D,(k-1)}^P$ is equal to the previous second A Posteriori probability stored in the second decoder; and
   the second decoder calculating the current second A Posteriori probability to derive the soft-information.

7. The SISO system according to claim 6, wherein the second iteration operation of the second decoder further comprises a second inner iteration operation, which comprises:
   the previous second A Posteriori probability $L_{D,(k-1)}^P$ stored in the second decoder being calculated inside the second decoder by the second inner iteration operation to derive the soft-information; and the second decoder outputting the soft-information until reaching times of the second inner iteration operation preset in the second decoder.

8. A SISO (soft input soft output) system for use in a wireless communication system, comprising:
   a transmitting terminal for generating an encoded signal by at least one transmitting antenna, the encoded signal indicative of electronic data;
   a channel in electronic communication with the transmittal terminal; and
   a receiver for receiving the encoded signal from the transmitting terminal via the channel by at least one receiving antenna, comprising:
      a first decoder, comprising:
         a first processor used to derive a current first A Posteriori probability according to each frame received;
         a first A Posteriori probability memory, used to store a previous first A Posteriori probability generated by the first A Posteriori probability, wherein a renewed intrinsic information is derived according to the current first A Posteriori probability derived by the first processor and the previous first A Posteriori probability stored in the first A Posteriori probability memory;
      a second decoder operative to derive a soft-information by a second iteration operation based on the renewed intrinsic information directly received from the first decoder, and then transmit the soft-information directly back to the first decoder for the iteration operation of the next renewed intrinsic information, wherein different frames are calculated respectively by the first decoder and the second decoder according to an instruction of the operational control unit, during the same cycle period; and
      a hard-decision for receiving the soft-information from the second decoder and outputting a hard-information;
   wherein the encoded signal is divided into the at least one frame by an operational control unit, the at least one frame is larger than two frames, wherein the hard-information comprises information of at least one of image, voices, and text.

9. The SISO system according to claim 8, wherein the second decoder outputs the soft-information when reaching preset times of the iteration operation.

10. The SISO system according to claim 8, wherein the first decoder further comprises a substractor, which is used to generate the renewed intrinsic information by subtracting the previous first A Posteriori probability from the current first A Posteriori probability.

11. The SISO system according to claim 8, wherein the second decoder further comprises:
   a second A Posteriori probability memory, used to store a previous second A Posteriori probability;
   an adder module, used to generate a current second A Posteriori probability by adding the renewed intrinsic information to the previous second A Posteriori probability, the current second A Posteriori probability being stored in the second A Posteriori probability memory to renew the previous second A Posteriori probability; and
   a second processor, used to receive the current second A Posteriori probability, and generate the soft-information for storing in the second A Posteriori probability memory.

12. The SISO system according to claim 11, wherein the second decoder further comprises an intrinsic information updating memory, which is used to store the renewed intrinsic information.

13. The SISO system according to claim 11, wherein the first processor and the second processor respectively operate different frames during the same cycle, and the first A Posteriori probability memory and the second A Posteriori probability memory respectively comprises a first memory block and a second memory block, the first memory block of the first A Posteriori probability memory and the second memory block of the first A Posteriori probability memory are used to read/write the previous first A Posteriori probabilities corresponding to the different frames, and the first memory block of the second A Posteriori probability memory and the second memory block of the second A Posteriori probability memory are used to read/write the previous second A Posteriori probabilities or the soft-information corresponding to the different frames.

14. The SISO system according to claim 8, wherein a formula of the first iteration operation of the first decoder is:
   The renewed intrinsic information=$L_{M,(k)}^P - L_{M,(k-1)}^P$;
   wherein K means times of iteration operations, and K is a positive integer;
   $L_{M,(k)}^P$=a current first A Posteriori probability,
   when K=1, the first decoder calculates each of the frames to derive the current first A Posteriori probability $L_{M,(k)}^P$; or
   when K>1, the soft-information fed back from the second decoder to the first decoder are calculated with the frame, to derive the current first A Posteriori probability $L_{M,(k)}^P$, and;
   $L_{M,(k-1)}^P$=a previous first A Posteriori probability,
   when K=1, $L_{M,(k-1)}^P$=0;
   when K>1, $L_{M,(k-1)}^P$ is equal to the previous first A Posteriori probability stored in the first decoder.

15. The SISO system according to claim 8, wherein the second iteration operation of the second decoder further comprises a second outer iteration operation, which comprises:
   a current second A Posteriori probability=$L_{D,(k)}^P = L_{D,(k-1)}^P + L_{M,(k)}^P - L_{M,(k-1)}^P$,
   wherein K means times of iteration operations, and K is a positive integer;
   $L_{M,(k)}^P$=current first A Posteriori probability,
   when K=1, the first decoder calculates the frame to derive the current first A Posteriori probability $L_{M,(k)}^P$; or
   when K>1, the soft-information fed back from the second decoder to the first decoder are calculated with the frame, to derive the current first A Posteriori probability $L_{M,(k)}^P$, and;
   $L_{M,(k-1)}^P$=previous first A Posteriori probability,
   when K=1, $L_{M,(k-1)}^P$=0;
   when K>1, $L_{M,(k-1)}^P$ is equal to the previous first A Posteriori probability stored in the first decoder;
   the renewed intrinsic information=$L_{M,(k)}^P - L_{M,(k-1)}^P$;
   $L_{D,(k)}^P$=a current second A Posteriori probability, which is derived according to the renewed intrinsic information received by second decoder;
   $L_{D,(k-1)}^P$=a previous second A Posteriori probability,
   when K=1, $L_{D,(k-1)}^P$=0;
   when K>1, $L_{D,(k-1)}^P$ is equal to the previous second A Posteriori probability stored in the second decoder; and
   the second decoder calculating the current second A Posteriori probability to derive the soft-information.

16. The SISO system according to claim 15, wherein the second iteration operation of the second decoder further comprises a second inner iteration operation, which comprises:
the previous second A Posteriori probability $L_{D,(k-1)}^P$ stored in the second decoder being calculated inside the second decoder by the second inner iteration operation to derive the soft-information, the second decoder outputting the soft-information until reaching times of the second inner iteration operation preset in the second decoder.

17. An operational method of applied for a SISO (soft input soft output) system for use in a wireless communication system, comprising the following steps of:
a step S01, generating an encoded signal by at least one transmitting antenna of a transmitting terminal, receiving the encoded signal from the transmitting terminal via a channel, and receiving a frame by a first decoder with at least one receiving antenna of a receiver, to derive a renewed intrinsic information by a first iteration operation, wherein the channel in electronic communication with the transmittal terminal;
a step S02, receiving the renewed intrinsic information directly from the first decoder, to generate a soft-information by a second iteration operation;
a step S03, determining whether times of the first decoder or the second decoder are reached; if no, performing a step S04; if yes, performing a step S05;
the step S04, directly transmitting the soft-information to the first decoder, then performing a step S06;
the step S05, outputting the soft-information to a hard-decision by the second decoder for outputting a hard-information;
the step S06, performing the first iteration operation by the first decoder, according to the frame and the soft-information, to generate the renewed intrinsic information, then performing the step S02;
wherein the renewed intrinsic information and the soft-information are transmitted in a frame form between the first decoder and the second decoder, and the first decoder and the second decoder respectively calculate different frames during the same cycle period;
wherein the encoded signal is divided into the different frames by an operational control unit, the at least one frame is larger than two frames, wherein the hard-information comprises information of at least one of image, voices, and text.

18. The operational method according to claim 17, wherein the step S01 further comprises the following step of proceeding the first iteration operation:
receiving the frame by a first processor of the first decoder to generate a current first A Posteriori probability; and using a substractor to subtract a previous first A Posteriori probability stored in a first A Posteriori probability memory from the current first A Posteriori probability, so as to generate the renewed intrinsic information.

19. The operational method according to claim 17, wherein the step S02 further comprises the following steps in proceeding the second iteration operation:
transmitting the renewed intrinsic information to an intrinsic information memory of the second decoder; using an adder module to add the renewed intrinsic information to a previous second A Posteriori probability stored in a second A Posteriori probability memory so as to generate a current second A Posteriori probability; and transmitting the current second A Posteriori probability to the second processor so as to derive the soft-information.

20. The operational method according to claim 17, wherein the step S02 further comprises the following steps in performing the second iteration operation:
using an adder module to add the renewed intrinsic information to a previous second A Posteriori probability stored in a second A Posteriori probability memory of the second decoder to derive a current second A Posteriori probability; and transmitting the current second A Posteriori probability to a second processor so as to derive the soft-information.

21. The operational method according to claim 18, wherein the first A Posteriori probability memory and the second A Posteriori probability memory respectively comprise a first memory block and a second memory block, the first memory block of the first A Posteriori probability memory and the second memory block of the first A Posteriori probability memory are used to read/write the previous first A Posteriori probabilities corresponding to the different frames, and the first memory block of the second A Posteriori probability memory and the second memory block of the second A Posteriori probability memory are used to read/write the previous second A Posteriori probabilities or the soft-information corresponding to different frames.

22. The operational method according to claim 19, wherein the first A Posteriori probability memory and the second A Posteriori probability memory respectively comprise a first memory block and a second memory block, the first memory block of the first A Posteriori probability memory and the second memory block of the first A Posteriori probability memory are used to read/write the previous first A Posteriori probabilities corresponding to the different frames, and the first memory block of the second A Posteriori probability memory and the second memory block of the second A Posteriori probability memory are used to read/write the previous second A Posteriori probabilities or the soft-information corresponding to different frames.

23. The operational method according to claim 20, wherein the first A Posteriori probability memory and the second A Posteriori probability memory respectively comprise a first memory block and a second memory block, the first memory block of the first A Posteriori probability memory and the second memory block of the first A Posteriori probability memory are used to read/write the previous first A Posteriori probabilities corresponding to the different frames, and the first memory block of the second A Posteriori probability memory and the second memory block of the second A Posteriori probability memory are used to read/write the previous second A Posteriori probabilities or the soft-information corresponding to different frames.

24. The operational method according to claim 17, wherein a formula of the first iteration operation of the first decoder is:
The renewed intrinsic information=$L_{M,(k)}^P - L_{M,(k-1)}^P$;
wherein K means times of iteration operations, and K is a positive integer;
$L_{M,(k)}^P$=current first A Posteriori probability,
when K=1, the first decoder calculates the frame to derive the current first A Posteriori probability $L_{M,(k)}^P$;
when K>1, the soft-information fed back from the second decoder to the first decoder are calculated with the frame, to derive the current first A Posteriori probability $L_{M,(k)}^P$, and;
$L_{M,(k-1)}^P$=previous first A Posteriori probability,
when K=1, $L_{M,(k-1)}^P$=0;

when K>1, $L_{M,(k-1)}^P$ is equal to the previous first A Posteriori probability stored in the first decoder.

25. The operational method according to claim 17, wherein the second iteration operation of the second decoder further comprises a second outer iteration operation, which comprises:
current second A Posteriori probability=$L_{D,(k)}^P$= $L_{D,(k-1)}^P + L_{M,(k)}^P - L_{M,(k-1)}^P$,
wherein K means times of iteration operation, and K is a positive integer;
$L_{M,(k)}^P$=current first A Posteriori probability,
when K=1, the first decoder calculates the frame to derive the current first A Posteriori probability $L_{M,(k)}^P$;
when K>1, the soft-information fed back from the second decoder to the first decoder are calculated with the frame, to derive the current first A Posteriori probability $L_{M,(k)}^P$, and;
$L_{M,(k-1)}^P$=previous first A Posteriori probability,
when K=1, $L_{M,(k-1)}^P$=0;
when K>1, $L_{M,(k-1)}^P$ is equal to the previous first A Posteriori probability stored in the first decoder;
the renewed intrinsic information=$L_{M,(k)}^P - L_{M,(k-1)}^P$;
$L_{D,(k)}^P$=current second A Posteriori probability, which is derived according to the renewed intrinsic information received by second decoder;
$L_{D,(k-1)}^P$=previous second A Posteriori probability,
when K=1, $L_{D,(k-1)}^P$=0;
when K>1, $L_{D,(k-1)}^P$ is equal to the previous second A Posteriori probability stored in the second decoder; and
the second decoder calculating the current second A Posteriori probability to derive the soft-information.

26. The operational method according to claim 25, wherein the second iteration operation of the second decoder further comprises a second inner iteration operation, which comprises:
the previous second A Posteriori probability $L_{D,(k-1)}^P$ stored in the second decoder being calculated inside the second decoder by the second inner iteration operation to derive the soft-information; and the second decoder outputting the soft-information until reaching times of the second inner iteration operation preset in the second decoder.

27. An iterative signal detection device, which comprises the SISO system according to claim 1.

28. An iterative signal detection device, which comprises the SISO system according to claim 2.

29. An iterative signal detection device, which comprises the SISO system according to claim 3.

30. An iterative signal detection device, which comprises the SISO system according to claim 4.

31. An iterative signal detection device, which comprises the SISO system according to claim 5.

32. An iterative signal detection device, which comprises the SISO system according to claim 6.

33. An iterative signal detection device, which comprises the SISO system according to claim 7.

34. An iterative signal detection device, which comprises the SISO system according to claim 8.

35. An iterative signal detection device, which comprises the SISO system according to claim 9.

36. An iterative signal detection device, which comprises the SISO system according to claim 10.

37. An iterative signal detection device, which comprises the SISO system according to claim 11.

38. An iterative signal detection device, which comprises the SISO system according to claim 12.

39. An iterative signal detection device, which comprises the SISO system according to claim 13.

40. An iterative signal detection device, which comprises the SISO system according to claim 14.

41. An iterative signal detection device, which comprises the SISO system according to claim 15.

42. An iterative signal detection device, which comprises the SISO system according to claim 16.

43. An iterative signal detection device, which comprises the SISO system according to claim 17.

44. An iterative signal detection device, which comprises the SISO system according to claim 18.

45. An iterative signal detection device, which comprises the SISO system according to claim 19.

46. An iterative signal detection device, which comprises the SISO system according to claim 20.

47. An iterative signal detection device, which comprises the SISO system according to claim 21.

48. An iterative signal detection device, which comprises the SISO system according to claim 22.

49. An iterative signal detection device, which comprises the SISO system according to claim 23.

50. An iterative signal detection device, which comprises the SISO system according to claim 24.

51. An iterative signal detection device, which comprises the SISO system according to claim 25.

52. An iterative signal detection device, which comprises the SISO system according to claim 26.

* * * * *